(12) United States Patent
Nishijima et al.

(10) Patent No.: US 8,791,208 B2
(45) Date of Patent: Jul. 29, 2014

(54) SHEET FOR SOLAR CELL ENCAPSULANT AND SOLAR CELL MODULE

(75) Inventors: Koichi Nishijima, Ichihara (JP); Yasuki Shibata, Ichihara (JP); Koji Kawano, Ichihara (JP)

(73) Assignee: Du Pont-Mitsui Polychemicals Co., Ltd., Tokyo (JP)

(*) Notice: Subject to any disclaimer, the term of this patent is extended or adjusted under 35 U.S.C. 154(b) by 302 days.

(21) Appl. No.: 13/201,027

(22) PCT Filed: Feb. 15, 2010

(86) PCT No.: PCT/JP2010/052230
§ 371 (c)(1),
(2), (4) Date: Aug. 11, 2011

(87) PCT Pub. No.: WO2010/095603
PCT Pub. Date: Aug. 26, 2010

(65) Prior Publication Data
US 2011/0319566 A1   Dec. 29, 2011

(30) Foreign Application Priority Data
Feb. 17, 2009   (JP) .................................. 2009-034246

(51) Int. Cl.
*C08L 33/02* (2006.01)
*C08L 33/04* (2006.01)

(52) U.S. Cl.
USPC ........... 525/222; 525/240; 525/221; 525/194; 428/98; 136/251; 136/256

(58) Field of Classification Search
None
See application file for complete search history.

(56) References Cited

U.S. PATENT DOCUMENTS

| 8,080,727 B2* | 12/2011 | Chou | 136/251 |
| 2002/0038664 A1* | 4/2002 | Zenko et al. | 136/251 |
| 2006/0160952 A1* | 7/2006 | Chou et al. | 525/191 |

FOREIGN PATENT DOCUMENTS

| CN | 101138095 | 3/2008 |
| JP | 62-014111 | 3/1987 |
| JP | 2001-332750 | 11/2001 |
| JP | 2005-126708 | 5/2005 |
| JP | 2005-232303 | 9/2005 |
| JP | 2006-036875 | 9/2006 |
| JP | 2010-059277 | 3/2010 |
| JP | 2010-080510 | 4/2010 |

OTHER PUBLICATIONS

Elvaloy 1609 AC flyer, 1996.*
EVOLUE SP 0540 flyer, 2005.*
EVOLUE SP 1540 flyer, 2005.*
LOTADER 3210 flyer, 1996.*
International Search Report dated May 18, 2010.
Chinese Patent Office Action filed on the corresponding Patent Application No. 201080007273.9 issued Dec. 26, 2012 and the English translation thereof.

* cited by examiner

*Primary Examiner* — Irina Krylova
(74) *Attorney, Agent, or Firm* — Rankin, Hill & Clark LLP

(57) ABSTRACT

Provided is a sheet for a solar cell encapsulant containing (A) an ethylene-based polymer having a melting point of 90° C. or higher and containing an ethylene-derived constituent unit as a main component; (B) an ethylene-vinyl acetate copolymer having a vinyl acetate-derived constituent unit at a content ratio of from 19% to 40% by mass; and (C) a silane coupling agent having an amino group. The sheet for solar cell encapsulant has the excellent transparency and flexibility possessed by an ethylene-vinyl acetate copolymer. Furthermore, a crosslinking treatment is substantially unnecessary, and adhesiveness and adhesion stability that are appropriate for practical use are obtained.

9 Claims, No Drawings

SHEET FOR SOLAR CELL ENCAPSULANT AND SOLAR CELL MODULE

TECHNICAL FIELD

The present invention relates to a sheet for solar cell encapsulant intended for fixing a solar cell element in a solar cell module, and a solar cell module using this sheet for solar cell encapsulant.

BACKGROUND ART

Under the circumstances of a recent rise in environmental problems, attention has been paid to hydroelectric power generation, wind power generation, and photovoltaic power generation as clean energy. Among these, photovoltaic power generation has seen a remarkable improvement in performance such as the power generation efficiency of solar cell modules, and an ongoing decrease in price, and national and local governments have worked on projects to promote the introduction of residential photovoltaic power generation systems. Thus, in recent years, the spread of photovoltaic power generation systems has advanced considerably.

By photovoltaic power generation, solar light energy is converted directly to electric energy using a semiconductor (solar cell element), such as a silicon cell. The performance of the solar cell element utilized there is deteriorated by contacting the outside air. Consequently, the solar cell element is sandwiched by an encapsulant or a protective film for providing buffering and prevention of contamination with a foreign substance or penetration of moisture.

As a sheet for this solar cell encapsulant, a crosslinking product of an ethylene-vinyl acetate copolymer having a vinyl acetate content of 25% to 33% by weight is generally used in view of transparency, flexibility, and adhesiveness to various members constituting a solar cell module, in view of durability to maintain these transparency, flexibility and adhesiveness for a long time, in view of processability into sheets, and in view of ease of handling in the form of a sheet during the manufacture of solar cell modules (see, for example, Patent Document 1).

Furthermore, incorporation of a silane coupling agent to improve the adhesiveness of a sheet for solar cell encapsulant which is formed of an ethylene-vinyl acetate copolymer is known (see, for example, Patent Document 2).

Patent Document 1: Japanese Examined Patent Application Publication (JP-B) No. 62-14111
Patent Document 2: Japanese Patent Application Laid-Open (JP-A) No. 2006-36875

DISCLOSURE OF INVENTION

Problem to be Solved by the Invention

The ethylene-vinyl acetate copolymer mentioned above exhibits a tendency that transparency or adhesiveness increases when the ratio of vinyl acetate increases. However, on the other hand, the copolymer is prone to acquire increased moisture permeability. Therefore, depending on the type of the top transparent protective material that is disposed on the sunlight-incident side of a solar cell module or the type of the back sheet that is disposed on the side opposite to this incident side, the conditions of adhesion, the use environment of the solar cell, and the like, the adhesiveness to the top transparent protective material or the back sheet may significantly decrease. In order to solve this problem due to moisture permeation, efforts have been made to attain moisture barrier by using a back sheet having high humidity barrier properties. Furthermore, efforts have also been made to attain moisture barrier by sealing the periphery of a module with a butyl rubber having high humidity barrier properties or the like. Accordingly, if a sheet for solar cell encapsulant having higher moisture barrier property is provided, such countermeasures for moisture barrier will be less necessary, and long-term durability may be expected.

As a method for improving the moisture barrier of a sheet for sealing solar cell, using an ethylene-vinyl acetate copolymer having a low content ratio of vinyl acetate can be proposed. However, such a copolymer has a tendency to decrease the transparency or flexibility of the resulting sheet. If transparency of a sheet is decreased, the amount of sunlight reception decreases, and there is a problem that the output power of solar cells is decreased. If flexibility of a sheet is decreased, there is a problem that the buffering properties with respect to external stresses are decreased. There is also a problem that the performance of protecting the silicon substrate of a light-receiving power generating element is deteriorated.

Furthermore, a sheet for solar cell encapsulant that is formed of the ethylene-vinyl acetate copolymer as described above requires a crosslinking process to obtain heat resistance. For that reason, production of solar cell modules takes up a longer time, and therefore, there is a demand for an improvement in terms of productivity. In order to improve productivity, shortening of the crosslinking time, or adopting a sheet form which substantially does not require a crosslinking process may be proposed. Furthermore, a crosslinking process requires facilities for the crosslinking operation, along with a space for installation of the apparatuses or electric power to operate the facilities for the crosslinking operation. Accordingly, such a crosslinking process causes an increase in production cost. Therefore, ultimately, a sheet form which substantially does not require a crosslinking process is preferable.

Under such circumstances, the present invention was made to solve the problems described above. That is, under such circumstances, there is a need for a sheet for solar cell encapsulant which has the excellent transparency and flexibility possessed by an ethylene-vinyl acetate copolymer, substantially does not require a crosslinking treatment, does not need any heating treatment for crosslinking, and has adhesiveness and adhesion stability (particularly, adhesiveness to a back sheet made of resin such a polyester or the like) appropriate for practical use. Furthermore, there is a need for a solar cell module which has a more stable cell performance, and has excellent durability and higher productivity as compared with conventional solar cell modules.

Means for Solving the Problem

Specific means for achieving the problems described above are as follows.

[1] A sheet for a solar cell encapsulant including (A) an ethylene-based polymer having a melting point of 90° C. or higher and containing an ethylene-derived constituent unit as a main component, (B) an ethylene-vinyl acetate copolymer having a vinyl acetate-derived constituent unit at a content ratio of from 19% to 40% by mass, and (C) a silane coupling agent having an amino group.

[2] The sheet for a solar cell encapsulant as described in [1] above, wherein (A) the ethylene-based polymer is an ethylene-vinyl acetate copolymer or ethylene-acrylic acid ester copolymer, in which a content ratio of the ethylene-derived constituent unit is from 85% to 99% by mass.

[3] The sheet for a solar cell encapsulant as described in [1] above, wherein (A) the ethylene-based polymer is a linear ethylene-α-olefin copolymer having a density of from 895 kg/m$^3$ to 941 kg/m$^3$.

[4] The sheet for a solar cell encapsulant as described in any one of the above [1] to [3], wherein the melt flow rates (MFR; according to JIS K7210-1999, at 190° C., under a load of 2160 g) of (A) the ethylene-based polymer and of (B) the ethylene-vinyl acetate copolymer are respectively in the range of from 0.1 to 50 g/10 min.

[5] The sheet for a solar cell encapsulant as described in any one of the above [1] to [4], wherein (C) the silane coupling agent is at least one of N-(β-aminoethyl)-γ-aminopropyltrimethoxysilane or N-(β-aminoethyl)-γ-aminopropylmethyldimethoxysilane.

[6] The sheet for a solar cell encapsulant as described in any one of the above [1] to [5], wherein the melting point of (A) the ethylene-based polymer is from 94° C. to 120° C.

[7] The sheet for a solar cell encapsulant as described in any one of the above [1] to [6], wherein (B) the ethylene-vinyl acetate copolymer has a content ratio of the vinyl acetate-derived constituent unit of from 19% to 40% by mass and a content ratio of an ethylene-derived constituent unit of from 81% to 60% by mass.

[8] A solar cell module including the sheet for a solar cell encapsulant as described in any one of the above [1] to [7].

Effect of the Invention

According to the invention, there is provided a sheet for solar cell encapsulant which has the excellent transparency and flexibility possessed by an ethylene-vinyl acetate copolymer, substantially does not require a crosslinking treatment, does not need a heating treatment for crosslinking, and has adhesiveness and adhesion stability (particularly, adhesiveness to a back sheet made of resin such a polyester or the like) appropriate for practical use.

Furthermore, according to the invention, there is provided a solar cell module which has more stable cell performance, excellent durability and high productivity as compared with conventional solar cell modules.

BEST MODE FOR CARRYING OUT THE INVENTION

Hereinafter, the sheet for solar cell encapsulant of the invention and a solar cell module having this sheet will be described in detail.

The sheet for solar cell encapsulant of the invention is characterized by containing at least (A) an ethylene-based polymer having a melting point of 90° C. or higher and containing an ethylene-derived constituent unit as a main component, (B) an ethylene-vinyl acetate copolymer having a vinyl acetate-derived constituent unit at a content ratio of from 19% to 40% by mass, and (C) a silane coupling agent having an amino group.

Examples of the ethylene-based copolymer having a melting point of 90° C. or higher, which is the component (A) constituting the sheet for solar cell encapsulant of the present invention, include an ethylene-vinyl acetate copolymer other than the component (B) shown below (the content ratio of the vinyl acetate-derived constituent unit is less than 19% by mass), an ethylene-acrylic acid ester copolymer, an ethylene-unsaturated carboxylic acid copolymer and an ionomer thereof, a high pressure method low density polyethylene, and an ethylene-α-olefin copolymer.

The ethylene-based copolymer for the component (A) is a copolymer which includes an ethylene-derived constituent unit as a main component. The term "main component" as used herein means that the ratio occupied by the "ethylene-derived constituent unit" in the total amount of the constituent units is 85% by mass or greater, and preferably 88% by mass or greater. At this time, the ethylene-based copolymer may further include monomer units other than ethylene (for example, vinyl acetate, or an acrylic acid ester). In addition, these copolymers are usually random copolymers.

The ethylene-vinyl acetate copolymer according to the component (A) includes the ethylene-derived constituent unit at a ratio of preferably 85% to 99% by mass, and more preferably 88% to 99% by mass. Furthermore, the ethylene-vinyl acetate copolymer suitably includes the constituent unit derived from vinyl acetate at a ratio of preferably 1% to 15% by mass, and more preferably 1% to 12% by mass. When the ratio of the ethylene-derived constituent unit is in the range described above, the copolymer has excellent heat resistance.

Among the ethylene-vinyl acetate copolymers for the component (A), copolymers in which the content ratio of the vinyl acetate-derived constituent unit is as small as a few percent by mass, may be treated as high pressure method low density polyethylene.

Examples of the acrylic acid ester that constitutes the ethylene-acrylic acid ester copolymer include (meth)acrylic acid esters such as methyl acrylate, ethyl acrylate, isobutyl acrylate, n-butyl acrylate, 2-ethylhexyl acrylate, methyl methacrylate, and isobutyl methacrylate.

In the ethylene-acrylic acid ester copolymer, the constituent unit derived from ethylene is included at a ratio of preferably 85% to 99% by mass, and more preferably 88% to 99% by mass. It is suitable that the constituent unit derived from an acrylic acid ester is included at a ratio of preferably 1% to 15% by mass, and more preferably 1% to 12% by mass. When the ratio of the constituent unit derived from ethylene is in the range described above, the copolymer has excellent heat resistance.

The ethylene-vinyl acetate copolymer, ethylene-acrylic acid ester copolymer, ethylene-unsaturated carboxylic acid copolymer, and high pressure method low density polyethylene may all be produced by a high pressure method such as an autoclave method or a tubular method, which are all conventionally known methods.

In the ethylene-α-olefin copolymer, when the content of all of the constituent units (monomer units) constituting the copolymer is designated as 100 mol %, the content ratio of the constituent unit derived from an α-olefin having 3 to 20 carbon atoms is preferably 5 mol % or greater, and more preferably 10 mol % or greater. When the content ratio of the α-olefin-derived constituent unit is in the range described above, the copolymer has excellent transparency and bleeding resistance (additive holding capability). Particularly, when flexibility is considered, it is preferable to use a polymer having a content ratio of the α-olefin-derived constituent unit of 15 mol % or greater. The upper limit of the content ratio is less than 50 mol %, preferably 40 mol % or less, and particularly preferably 30 mol % or less.

Specific examples of the α-olefin having 3 to 20 carbon atoms include linear α-olefins such as propylene, 1-butene, 1-pentene, 1-hexene, 1-heptene, 1-octene, 1-nonene, 1-decene, 1-undecene, 1-dodecene, 1-tridecene, 1-tetradecene, 1-pentadecene, 1-hexadecene, 1-heptadecene, 1-octadecene, 1-nonadecene, and 1-eicosene; and branched α-olefins such as 3-methyl-1-butene, 3-methyl-1-pentene, 4-methyl-1-pentene, 2-ethyl-1-hexene, and 2,2,4-trimethyl-1-pentene. These may be used in combination of two kinds.

Among them, the carbon number of the α-olefin is preferably 3 to 10, and more preferably 3 to 8, from the viewpoint of general-purpose usability (cost, mass producibility, or easy availability).

The ethylene-α-olefin copolymer is preferably an ethylene-propylene copolymer (meaning an ethylene-propylene copolymer having an ethylene-derived constituent unit content of 50 mol % or greater), an ethylene-1-butene copolymer (meaning an ethylene-1-butene copolymer having an ethylene-derived constituent unit content of 50 mol % or greater), an ethylene-4-methyl-1-pentene copolymer (meaning an ethylene-4-methyl-1-pentene copolymer having an ethylene-derived constituent unit content of 50 mol % or greater), or an ethylene-1-hexene copolymer (meaning an ethylene-1-hexene copolymer having an ethylene-derived constituent unit content of 50 mol % or greater).

The ratio of the α-olefin-derived constituent unit in these copolymers is preferably 5 mol % or greater, and more preferably 10 mol % or greater, when the total amount of the constituent units (monomer units) constituting each copolymer is designated as 100 mol %.

In the sheet for sealing solar cell, the ethylene-α-olefin-based copolymer may be used individually, or two or more kinds may be used in combination.

The ethylene-α-olefin-based copolymer having such a nature as described above may be produced by a slurry polymerization method, a solution polymerization method, a bulk polymerization method, a gas phase polymerization method or the like, by using a metallocene catalyst. Examples of the catalyst include those metallocene catalysts described in JP-A Nos. 58-19309, 60-35005, 60-35006, 60-35007, 60-35008, 61-130314, 3-163088, 4-268307, 9-12790, 9-87313, 10-508055 and 11-80233, and PCT Japanese Translation Patent Publication No. 10-508055. Furthermore, a particularly preferable example of the production method using a metallocene catalyst may be the method described in European Patent Application No. 1211287.

The ethylene-α-olefin-based copolymer can also be produced by copolymerizing ethylene and other α-olefins in the presence of not only a metallocene catalyst but also a vanadium-based catalyst composed of a soluble vanadium compound and organic aluminum halide, or a metallocene catalyst composed of a metallocene compound such as a zirconium compound coordinated by a cyclopentadienyl group and an organic aluminum oxy compound.

The ethylene-α-olefin copolymers produced by such production methods as described above are substantially linear and are rigid.

The component (A) is preferably a linear ethylene-α-olefin copolymer which is synthesized using a Ziegler-Natta catalyst and a metallocene catalyst and has a density of 895 kg/m$^3$ or greater. When the density is 895 kg/m$^3$ or greater, heat resistance of the copolymer is excellent.

The upper limit of the density of the linear ethylene-α-olefin copolymer is not particularly limited from the viewpoint of heat resistance. However, when other performances as a solar cell encapsulant are considered, the density is preferably 941 kg/m$^3$ or less. A more preferable reference range for a linear ethylene-α-olefin copolymer is from 900 to 929 kg/m$^3$ for low density polyethylene that is conventionally available in market.

Among the polymers described above, an ethylene-vinyl acetate copolymer or an ethylene acrylic acid ester copolymer, both of which have a content ratio of the ethylene-derived constituent unit of from 85% to 99% by mass, is more preferable as the component (A) from the viewpoint of further increasing the heat resistance of the sheet.

Apart from this, the component (A) is more preferably an ethylene-vinyl acetate copolymer or an ethylene-acrylic acid ester copolymer from the viewpoint of increasing the adhesiveness to glass or a polyester sheet as a constituent member of a solar cell module.

The ethylene-based copolymer as the component (A) has a melting point of 90° C. or higher. If the melting point is lower than 90° C., heat resistance of the sheet is insufficient. The melting point is preferably 90° C. or higher, and more preferably 94° C. or higher, for the same reason. The upper limit is preferably 120° C.

The melting point according to the invention is a value measured by differential scanning calorimetry (DSC).

The ethylene-based copolymer as the component (A) may be used individually, or two or more kinds may be used in combination.

The content of the ethylene-based copolymer in the sheet for solar cell encapsulant is preferably from 40% to 90% by mass, and more preferably from 50% to 80% by mass, based on the total mass of the sheet. When the content of the ethylene-based copolymer is in the range described above, heat resistance of the sheet may be further increased.

The ethylene-vinyl acetate copolymer which is the component (B) constituting the sheet for solar cell encapsulant of the invention is an ethylene-vinyl acetate copolymer in which the content ratio of the constituent unit derived from vinyl acetate is from 19% to 40% by mass, preferably from 19% to 35% by mass, and more preferably from 25% to 35% by mass. When the ratio of the vinyl acetate-derived constituent unit is less than 19% by mass, transparency, adhesiveness and flexibility are insufficient, and therefore, it is not preferable. Furthermore, when the ratio of the vinyl acetate-derived constituent unit is greater than 40% by mass, sheet molding is difficult. Even if a sheet for solar cell encapsulant is produced, processability at the time of production of solar cell modules is impaired, and therefore, it is not preferable from the viewpoint that the sheet becomes markedly tackified. According to the invention, it is important that the sheet contains both the component (A) and the component (B), and from the viewpoint of separation of the two components and the ranges in which the two components may be used, the content ratio of the constituent unit derived from vinyl acetate of the component (B) is set to the range described above.

In this regard, the ethylene-vinyl acetate copolymer may further include monomer units other than vinyl acetate and ethylene. According to the invention, it is more preferable that the ethylene-vinyl acetate copolymer does not include any other monomer unit, and the content ratio of the constituent unit derived from vinyl acetate is from 19% to 40% by mass (preferably 19% to 35% by mass), while the content ratio of the constituent unit derived from ethylene is from 60% to 81% by mass (preferably 65% to 81% by mass).

The ethylene-vinyl acetate copolymer as the component (B) may be used individually, or two or more kinds having different copolymerization ratios or the like may be used in combination.

The content of the ethylene-vinyl acetate copolymer in the sheet for solar cell encapsulant is more preferably 10% to 60% by mass, and more preferably 20% to 50% by mass, based on the total mass of the sheet. When the content of the ethylene-vinyl acetate copolymer is in the range described above, transparency, flexibility and processability may be imparted. Furthermore, when the content is in the range described above, adhesiveness and adhesion stability (particularly, adhesiveness to a back sheet made of a resin such as polyester) may be improved.

Both of the component (A) and the component (B) that constitute the sheet for solar cell encapsulant of the invention preferably have the melt flow rate (according to JIS K7210-1999, at 190° C., under a load of 2160 g; hereinafter, may be abbreviated to MFR) that is in the range of from 0.1 to 100 g/10 min. More preferably, the melt flow rate is in the range of from 0.1 to 50 g/10 min. When the melt flow rate is selected to be in this range, the sheet processability required for a sheet for solar cell encapsulant is enhanced, and a desired sheet may be obtained. In this way, when a solar cell module is produced, excellent adhesiveness and an effect of suppressing any unnecessary squeezing out are obtained.

Examples of the silane coupling agent having an amino group as the component (C) that constitutes the sheet for solar cell encapsulant of the invention include aminotrialkoxysilanes such as 3-aminopropyltrimethoxysilane, 3-aminopropyltriethoxysilane, and N-(β-aminoethyl)-γ-aminopropyltrimethoxysilane; and aminodialkoxysilanes such as N-(β-aminoethyl)-γ-aminopropylmethyldimethoxysilane, N-(β-aminoethyl)-γ-aminopropylmethyldiethoxysilane, N-(β-aminoethyl)-γ-aminopropyldimethoxysilane, 3-aminopropylmethyldimethoxysilane, 3-aminopropylmethyldiethoxysilane, N-phenyl-3-aminopropylmethyldimethoxysilane, N-phenyl-3-aminopropylmethyldiethoxysilane, 3-methyldimethoxysilyl-N-(1,3-dimethylbutylidene)propylamine, and 3-methyldimethoxysilyl-N-(1,3-dimethylbutylidene)propylamine.

Among these, from the viewpoint of adhesiveness, 3-aminopropyltrimethoxysilane, 3-aminopropyltriethoxysilane, N-(β-aminoethyl)-γ-aminopropyltrimethoxysilane, N-(β-aminoethyl)-γ-aminopropylmethyldimethoxysilane, N-(β-aminoethyl)-γ-aminopropylmethyldiethoxysilane, N-(β-aminoethyl)-γ-aminopropyldimethoxysilane, 3-aminopropylmethyldimethoxysilane, 3-aminopropylmethyldiethoxysilane and the like are preferable. Particularly, 3-aminopropyltrimethoxysilane, N-(β-aminoethyl)-γ-aminopropyltrimethoxysilane and N-(β-aminoethyl)-γ-aminopropylmethyldimethoxysilane are preferable.

When a trialkoxysilane is used, it is preferable because adhesiveness may be further enhanced. When a dialkoxysilane is used, it is preferable because processing stability may be maintained at the time of sheet molding.

The alkoxysilane having an amino group as the component (C) may be used individually, or two or more kinds may be used in combination.

The content of the alkoxysilane having an amino group in the sheet for solar cell encapsulant is a ratio of 3 parts by mass or less, preferably from 0.03 to 3 parts by mass, and particularly preferably from 0.05 to 1.5 parts by mass, based on 100 parts by mass of the total amount of the component (A) and the component (B), from the viewpoint of increasing adhesiveness effect and processing stability at the time of sheet molding. When the silane coupling agent is included in the range described above, adhesiveness to a multilayer sheet, a protective material, a solar cell element or the like is enhanced, which is preferable.

It is preferable to incorporate an ultraviolet absorbent, a light stabilizer, an antioxidant and the like into the ethylene-(meth)acrylic acid copolymer or an ionomer thereof, in order to prevent deterioration of the sheet due to exposure to ultraviolet radiation.

Examples of the ultraviolet absorbent include benzophenones such as 2-hydroxy-4-methoxybenzophenone, 2,2'-dihydroxy-4-methoxybenzophenone, 2-hydroxy-4-methoxy-2-carboxybenzophenone, and 2-hydroxy-4-n-octoxybenzophenone; benzotriazoles such as 2-(2'-hydroxy-3',5'-di-t-butylphenyl)benzotriazole, 2-(2'-hydroxy-5-methylphenyl)benzotriazole, and 2-(2'-hydroxy-5-t-octylphenyl)benzotriazole; and salicylic acid esters such as phenyl salicylate and p-octylphenyl salicylate.

Examples of the light stabilizer include hindered amine compounds.

Examples of the antioxidant include various hindered phenol compounds and phosphite compounds.

The antioxidant, light stabilizer and ultraviolet absorbent may be incorporated respectively in an amount of usually 5 parts by mass or less, and preferably from 0.1 to 3 parts by mass, based on 100 parts by mass of the total amount of the component (A) and the component (B).

Furthermore, additives such as a colorant, a light diffusing agent and a flame retardant may be incorporated into the sheet for solar cell encapsulant optionally.

Examples of the colorant include pigments, inorganic compounds and dyes or the like. Particularly, examples of white colorants include titanium oxide, zinc oxide and calcium carbonate.

Examples of the light diffusing agent include inorganic spherical materials such as glass beads, silica beads, silicon alkoxide beads, and hollow glass beads. Other examples include organic spherical materials such as acrylic-based or vinylbenzene-based plastic beads.

Examples of the flame retardant include halogen-based flame retardants such as bromides, phosphorus-based flame retardants, silicon-based flame retardants, and metal hydroxides such as magnesium hydroxide and aluminum hydroxide.

When a sheet containing these additives is used as an encapsulant on the light-receiving side of the solar cell element, through which sunlight is received, transparency may be impaired. However, this sheet is suitably used when the sheet is used as an encapsulant on the opposite surface of the light-receiving side of the solar cell element.

According to the invention, the total thickness of the sheet for solar cell encapsulant is preferably in the range of from 0.05 to 2 mm. That is, when the total thickness of the sheet is 0.05 mm or greater, damage of the solar cell element due to an impact or the like is reduced. When the total thickness of the sheet is 2 mm or less, the sheet acquires transparency, and the amount of sunlight reception is maintained, so that the output power may be maintained to be high.

The molding of the sheet for solar cell encapsulant of the invention may be carried out according to a known method of using a T-die extruder, a calendar molding machine, an inflation molding machine or the like.

For example, the sheet for solar cell encapsulant may be obtained by dry blending in advance the component (A), the component (B), the component (C) and additives such as an antioxidant, a light stabilizer and an ultraviolet absorbent, supplying the blend from the hopper of an extruder, and extrusion molding the blend into a sheet form.

Furthermore, the sheet for solar cell encapsulant may be obtained by melt blending in advance the component (A) and the component (B), subsequently drying blending the component (C) and additives such as an antioxidant, a light stabilizer and an ultraviolet absorbent, supplying the blend from the hopper of an extruder, and extrusion molding the blend into a sheet form.

As another means, it is also possible to make a master batch of the component (C) and additives such as an antioxidant, a light stabilizer and an ultraviolet absorbent in advance, and then to add the master batch.

The processing temperature may be selected in accordance with the processability of the components used in the range of from 120° C. to 250° C.

A solar cell module may be produced by using the sheet for solar cell encapsulant of the invention and fixing a solar cell element with upper and lower protective materials. Such a solar cell module may be exemplified by various types. Examples thereof include a module having a configuration in which the sheets for encapsulant are placed on both sides of a solar cell element and, such as in the form of upper transparent protective material/sheet for encapsulant/solar cell element/sheet for encapsulant/lower protective material; a module having a configuration in which a solar cell element formed on the surface of a substrate such as a glass plate are placed between encapsulants and sandwiched from both sides of the solar cell element, such as in the form of upper transparent protective material/sheet for encapsulant/solar cell element/sheet for encapsulant/lower protective material; and a module having a configuration in which the sheet for encapsulant and a lower protective material are formed on a solar cell element formed on the inner peripheral surface of an upper transparent protective material, for example an amorphous solar cell element was formed by sputtering or the like on a fluororesin-based sheet.

As the solar cell element, various solar cell elements such as silicon type such as single crystal silicon, polycrystalline silicon, and amorphous silicon and the like; and semiconductor type of Group III-V compounds or Group II-VI compounds such as gallium-arsenic, copper-indium-selenium, copper-indium-gallium-selenium, and cadmium-tellurium and the like, may be used. The sheet for encapsulant of the invention is particularly useful for the encapsulating the amorphous silicon solar cell elements.

Examples of the upper transparent protective material that constitutes a solar cell module include glass, an acrylic resin, polycarbonate, polyester, and a fluorine-containing resin. The lower protective material is a sheet of a simple substance or multiple layers of metals or various thermoplastic resin films, and examples thereof include single-layer or multilayer sheets of inorganic materials including metals such as tin, aluminum and stainless steel, and glass; polyesters, inorganic material-deposited polyesters, fluorine-containing resins, and polyolefins. The sheet for encapsulant of the invention exhibits excellent adhesiveness to these upper or lower protective materials.

In order to laminate and bond such the solar cell element, upper protective material and lower protective material as described above together using the sheet for solar cell encapsulant of the invention, even if a crosslinking process based on pressure heating over a long time, which has been carried out for conventional ethylene-vinyl acetate copolymer systems, was not carried out, an adhesive strength that is capable of withstanding practical use, and long-term stability of the adhesive strength may be obtained. However, from the viewpoint of giving enough adhesion strength and long-term stability, it is recommended to apply a pressure heating treatment for any length of time.

EXAMPLES

Hereinafter, the invention will be more specifically explained based on Examples, but the invention is not intended to be limited to the following Examples as long as the gist is maintained. Unless particularly stated otherwise, the unit "part" is on a mass basis.

The details of the components used in the production of a sheet for solar cell encapsulant are as follows.

[Component (A)]

(A-1) Ethylene-vinyl acetate copolymer (EVA):
Vinyl acetate (VA)-derived constituent unit: 10% by mass, ethylene-derived constituent unit: 90% by mass, MFR 3 g/10 min, melting point: 96° C.

(A-2) Ethylene-methyl acrylate copolymer (EMA):
Methyl acrylate (MA)-derived constituent unit: 6% by mass, ethylene-derived constituent unit: 94% by mass, MFR 2 g/10 min, melting point: 101° C.

(A-3) Ethylene-α-olefin copolymer:
Linear low-density polyethylene obtained by copolymerizing an α-olefin having 6 carbon atoms and ethylene (main component), density 903 kg/m³, MFR 3.7 g/10 min, melting point: 98° C. (EVOLUE SP0540 manufactured by Prime Polymer Co., Ltd.)

(A-4) Ethylene-α-olefin copolymer:
Linear low-density polyethylene obtained by copolymerizing an α-olefin having 6 carbon atoms and ethylene (main component), density 913 kg/m³, MFR 3.7 g/10 min, melting point: 113° C. (EVOLUE SP1540 manufactured by Prime Polymer Co., Ltd.)

(A-4) Ethylene-α-olefin copolymer:
Linear low-density polyethylene obtained by copolymerizing an α-olefin having 6 carbon atoms and ethylene (main component), density 913 g/m³, MFR 3.7 g/10 min, melting point: 113° C. (EVOLUE SP1540 manufactured by Prime Polymer Co., Ltd.)

[Component (B)]

(B-1) Ethylene-vinyl acetate copolymer (EVA):
Vinyl acetate (VA)-derived constituent unit: 28% by mass, ethylene-derived constituent unit: 72% by mass, MFR 15 g/10 min, melting point: 71° C.

(B-2) Ethylene-vinyl acetate copolymer (EVA):
Vinyl acetate (VA)-derived constituent unit: 33% by mass, ethylene-derived constituent unit: 67% by mass, MFR 14 g/10 min, melting point: 63° C.

[Component (C)]
•N-(β-aminoethyl)-γ-aminopropyltrimethoxysilane [(D) Various additives]

(D-1) Ultraviolet absorbent: UVINUL 3039, manufactured by BASF SE (D-2) Light-resistant stabilizer: UVINUL 5050H manufactured by BASF SE (D-3) Antioxidant: IRGANOX 1010, manufactured by BASF Japan Ltd.

Example 1

70 parts of the component (A-1) and 30 parts of the component (B-1) were melt blended in advance at a processing temperature of 180° C. (40 mmφ single-screw extruder, L/D=28, front tip Dulmage screw, 40 rpm). Subsequently, 0.3 parts of N-(β-aminoethyl)-γ-aminopropyltrimethoxysilane (C), 0.12 parts of the ultraviolet absorbent (D-1), 0.06 parts of a light-resistant stabilizer (D-2), and 0.03 parts of an antioxidant (D-3) were incorporated to the melt blend. A 0.4-mm thick sheet was produced from this mixture using a 40-mmφ single-screw T-die molding machine at a resin temperature of 160° C.

(Evaluation)

Evaluations of the glass adhesive strength, PET adhesive strength, and heat resistance were carried out by the methods described below, using the sheet thus obtained. The evaluation results are presented in the following Table 1.

(1) Adhesive Strength to Glass

The sheet produced using a T-die molding machine was mounted on a glass plate having a thickness of 3.2 mm (tin side: tempered float-glass(tempered glass) manufactured by Asahi Glass Co., Ltd.), and the assembly was bonded together using a vacuum bonding machine at 150° C. for 10 min. Subsequently, the assembly was subjected to a heat treatment in an oven at 150° C. for 30 minutes. The evaluation of the adhesive force to glass was carried out under the conditions of a short strip having a width of 10 mm and a tensile rate of 50 mm/min, by pulling an end of the sheet in a direction perpendicular to the glass surface.

When the adhesive strength was 10 N/10 mm or greater, particularly 15 N/10 mm, the superior adhesiveness was indicated.

(2) Adhesive Strength to Back Sheet

The sheet produced using a T-die molding machine was mounted on a glass plate having a thickness of 3 mm (tin side). A back sheet (manufactured by Toyo Aluminum K.K., constitution: white PET/PET/silica-deposited PET) was mounted on this sheet, and the assembly was bonded together using a vacuum bonding machine at 150° C. for 10 min. Subsequently, the assembly was subjected to a heat treatment in an oven at 150° C. for 30 minutes. The evaluation of the adhesive force to the back sheet was carried out under the conditions of a short strip having a width of 10 mm and a tensile rate of 50 mm/min, by pulling an end of the back sheet in a direction perpendicular to the glass surface.

(3) Heat Resistance

The sheet produced using a T-die molding machine was used, and on a glass plate having a thickness of 3.2 mm (tin side; a white tempered plate glass (non-iron tempered glass) manufactured by Asahi Glass Co., Ltd.), the sheet, a polycrystalline silicon cell (Photowatt Technologies, Inc., PWP4CP3 101 mm×101 mm, polycrystalline silicon cell, thickness 250 μm), the sheet and a back sheet (manufactured by MA Packaging Co., Ltd.; ALTD15) were mounted in this order. The assembly was bonded together with a vacuum bonding machine at 150° C. for 10 minutes. Subsequently, the assembly was treated at 150° C. for 30 minutes. The cell position of the sample thus obtained was marked in advance. This sample was fixed at an angle of 60°, and was treated in an oven at 100° C. for 8 hours. Thereafter, displacements from the initial cell position were checked by visual inspection.

Example 2

70 parts of the component (A-3) and 30 parts of the component (B-1) were melt blended in advance at a processing temperature of 180° C. (40 mmφ single-screw extruder, L/D=28, front tip Dulmage screw, 40 rpm). Subsequently, 0.3 parts of N-(β-aminoethyl)-γ-aminopropyltrimethoxysilane (C), 0.12 parts of the ultraviolet absorbent (D-1), 0.06 parts of a light-resistant stabilizer (D-2), and 0.03 parts of an antioxidant (D-3) were incorporated to the melt blend. This mixture was produced into a 0.4-mm thick sheet using a 40-mmφ single-screw T-die molding machine at a resin temperature of 160° C. Using this sheet, evaluations of the glass adhesive strength, PET adhesive strength, and heat resistance were carried out in the same manner as in Example 1. The evaluation results are presented in the following Table 1.

Example 3

70 parts of the component (A-1) and 30 parts of the component (B-2) were melt blended in advance at a processing temperature of 180° C. (40 mmφ single-screw extruder, L/D=28, front tip Dulmage screw, 40 rpm). Subsequently, 0.3 parts of N-(β-aminoethyl)-γ-aminopropyltrimethoxysilane (C), 0.12 parts of the ultraviolet absorbent (D-1), 0.06 parts of a light-resistant stabilizer (D-2), and 0.03 parts of an antioxidant (D-3) were incorporated to the melt blend. A 0.4-mm thick sheet was produced from this mixture using a 40-mmφ single-screw T-die molding machine at a resin temperature of 160° C. Using this sheet, evaluations of the glass adhesive strength, PET adhesive strength, and heat resistance were carried out in the same manner as in Example 1. The evaluation results are presented in the following Table 1.

Example 4

70 parts of the component (A-3) and 30 parts of the component (B-2) were melt blended in advance at a processing temperature of 180° C. (40 mmφ single-screw extruder, L/D=28, front tip Dulmage screw, 40 rpm). Subsequently, 0.3 parts of N-(β-aminoethyl)-γ-aminopropyltrimethoxysilane (C), 0.12 parts of the ultraviolet absorbent (D-1), 0.06 parts of a light-resistant stabilizer (D-2), and 0.03 parts of an antioxidant (D-3) were incorporated to the melt blend. A 0.4-mm thick sheet was produced from this mixture using a 40-mmφ single-screw T-die molding machine at a resin temperature of 160° C. Using this sheet, evaluations of the glass adhesive strength, PET adhesive strength, and heat resistance were carried out in the same manner as in Example 1. The evaluation results are presented in the following Table 1.

Example 5

70 parts of the component (A-4) and 30 parts of the component (B-2) were melt blended in advance at a processing temperature of 180° C. (40 mmφ single-screw extruder, L/D=28, front tip Dulmage screw, 40 rpm). Subsequently, 0.3 parts of N-(β-aminoethyl)-γ-aminopropyltrimethoxysilane (C), 0.12 parts of the ultraviolet absorbent (D-1), 0.06 parts of a light-resistant stabilizer (D-2), and 0.03 parts of an antioxidant (D-3) were incorporated to the melt blend. A 0.4-mm thick sheet was produced from this mixture using a 40-mmφ single-screw T-die molding machine at a resin temperature of 160° C. Using this sheet, evaluations of the glass adhesive strength, PET adhesive strength, and heat resistance were carried out in the same manner as in Example 1. The evaluation results are presented in the following Table 1.

Example 6

70 parts of the component (A-2) and 30 parts of the component (B-2) were melt blended in advance at a processing temperature of 180° C. (40 mmφ single-screw extruder, L/D=28, front tip Dulmage screw, 40 rpm). Subsequently, 0.3 parts of N-(β-aminoethyl)-γ-aminopropyltrimethoxysilane (C), 0.12 parts of the ultraviolet absorbent (D-1), 0.06 parts of a light-resistant stabilizer (D-2), and 0.03 parts of an antioxidant (D-3) were incorporated to the melt blend. A 0.4-mm thick sheet was produced from this mixture using a 40-mmφ single-screw T-die molding machine at a resin temperature of 160° C. Using this sheet, evaluations of the glass adhesive strength, PET adhesive strength, and heat resistance were carried out in the same manner as in Example 1. The evaluation results are presented in the following Table 1.

TABLE 1

| | Adhesive strength to glass [N/10 mm] | Adhesive strength to back sheet [N/10 mm] | Heat resistance |
| --- | --- | --- | --- |
| Example 1 | 27 | 278 | No displacement |
| Example 2 | 26 | 201 | No displacement |
| Example 3 | 26 | 280 | No displacement |
| Example 4 | 18 | 180 | No displacement |
| Example 5 | 14 | 163 | No displacement |
| Example 6 | 25 | 358 | No displacement |

As shown in Table 1, the respective Examples were excellent in the adhesiveness to glass and back sheets, and had satisfactory heat resistance.

The entire disclosure of Japanese Patent Application No. 2009-034246 has been incorporated in this specification by reference.

All documents, patent applications and technical specifications recited in this specification are incorporated herein by reference in this specification to the same extent as if each individual publication, patent applications and technical standard was specifically and individually indicated to be incorporated by reference.

The invention claimed is:

1. A sheet for a solar cell encapsulant, consisting of:
   (A) 50% to 90% by mass of an ethylene-based polymer having a melting point of 90° C. or higher and containing an ethylene-derived constituent unit as a main component, wherein (A) the ethylene-based polymer is an ethylene-vinyl acetate copolymer consisting of an ethylene-derived constituent unit and a vinyl acetate-derived constituent unit in which a content ratio of the ethylene-derived constituent unit is 88% or more by mass or an ethylene-acrylic acid ester copolymer consisting of an ethylene-derived constituent unit and an acrylic acid ester-derived constituent unit in which a content ratio of the ethylene-derived constituent unit is 94% or more by mass and a content ratio of the acrylic acid ester-derived constituent unit is 6% or less by mass;
   (B) 10% to 50% by mass of an ethylene-vinyl acetate copolymer having a vinyl acetate-derived constituent unit at a content ratio of from 19% to 40% by mass;
   (C) a silane coupling agent having an amino group; and optionally an ultraviolet absorbent, a light stabilizer, an antioxidant, a colorant, a light diffusing agent a frame retardant, or combinations thereof.

2. The sheet for a solar cell encapsulant according to claim 1, wherein the melt flow rates (according to JIS K7210-1999, at 190° C., under a load of 2160 g) of (A) the ethylene-based polymer and of (B) the ethylene-vinyl acetate copolymer are respectively in the range of from 0.1 to 50 g/10 min.

3. The sheet for a solar cell encapsulant according to claim 1, wherein (C) the silane coupling agent is at least one selected from the group consisting of N-(β-aminoethyl)-γ-aminopropyltrimethoxysilane and N-(β-aminoethyl)-γ-aminopropylmethyldimethoxysilane.

4. The sheet for a solar cell encapsulant according to claim 1, wherein the melting point of (A) the ethylene-based polymer is from 94° C. to 120° C.

5. The sheet for a solar cell encapsulant according to claim 1, wherein (B) the ethylene-vinyl acetate copolymer has a content ratio of the vinyl acetate-derived constituent unit of from 19% to 40% by mass and a content ratio of an ethylene-derived constituent unit of from 81% to 60% by mass.

6. A solar cell module comprising the sheet for a solar cell encapsulant according to claim 1.

7. The sheet for a solar cell encapsulant according to claim 1, wherein the sheet is not subject to a crosslinking treatment of (B) the ethylene-vinyl acetate copolymer.

8. The sheet for a solar cell encapsulant according to claim 1, wherein (A) the ethylene-based polymer is the ethylene-vinyl acetate copolymer.

9. The sheet for a solar cell encapsulant according to claim 1, wherein (A) the ethylene-based polymer is the ethylene-acrylic acid ester copolymer.

* * * * *